(12) United States Patent
Huang

(10) Patent No.: US 6,446,709 B1
(45) Date of Patent: Sep. 10, 2002

(54) COMBINATION HEAT RADIATOR

(75) Inventor: Meng-Cheng Huang, Panchiao (TW)

(73) Assignee: Wuh Choung Industrial Co., Ltd., Taipei Hsien (TW)

( * ) Notice: Subject to any disclaimer, the term of this patent is extended or adjusted under 35 U.S.C. 154(b) by 3 days.

(21) Appl. No.: 09/993,549

(22) Filed: Nov. 27, 2001

(51) Int. Cl.[7] ............................................. F28F 7/00
(52) U.S. Cl. ........................ 165/80.3; 165/185; 361/697
(58) Field of Search ............................... 165/80.3, 185; 174/16.3; 361/704, 697; 29/890.03; 257/722

(56) References Cited

U.S. PATENT DOCUMENTS

| | | | | |
|---|---|---|---|---|
| 3,187,812 A | * | 6/1965 | Staver | 165/185 |
| 4,236,578 A | * | 12/1980 | Kreith et al. | 165/185 |
| 4,588,058 A | * | 5/1986 | Marshall et al. | 165/185 |
| 5,311,928 A | * | 5/1994 | Marton | 257/722 |
| 5,406,451 A | * | 4/1995 | Korinsky | 174/16.3 |
| 6,000,132 A | * | 12/1999 | Bulter | 29/890.03 |
| 6,279,648 B1 | * | 8/2001 | Diels et al. | 165/80.3 |
| 6,340,056 B1 | * | 1/2002 | Hunag et al. | 165/185 |

* cited by examiner

Primary Examiner—Henry Bennett
Assistant Examiner—Terrell McKinnon
(74) Attorney, Agent, or Firm—Rosenberg, Klein & Lee

(57) ABSTRACT

The present invention provides a combination heat radiator, which is a plate body formed by cutting thermal conductive material like aluminum, copper, or graphite. A plurality of spaced openings are formed by punching one side of the plate body. A connection portion is disposed on the other side of the plate body. Remaining materials of the openings are bent upwards to form a plurality of heat-radiating fins. The openings of the plate body are staggered with openings of another plate body to facilitate engagement of the two plate bodies. Complete heat-radiating fins are thus formed. The size of the connection portion can be enlarged to be directly placed on different heat-emitting devices for use. The connection portion can be bent to match the shape of a heat-radiating device, thereby enhancing practicability of the heat-radiating fins. Moreover, the production cost can be effectively reduced, and heat-radiating efficiency can be greatly enhanced.

6 Claims, 7 Drawing Sheets

COMBINATION HEAT RADIATOR

FIELD OF THE INVENTION

The present invention relates to a combination heat radiator and, more particularly, to an improved combination heat radiator capable of increasing contact area with an electronic heat-emitting device and being bent to match the shape of an optoelectronic heat-emitting device.

BACKGROUND OF THE INVENTION

Along with continual progress of scientific technology, operational speeds of electronic tools (e.g., host computers, personal digital assistants, etc.) become faster and faster. Heat generated therein becomes more and more accordingly. In order to effectively radiate heat out of the system so that each device therein can operate under permissible temperatures, heat-radiating systems have become indispensable accessories in today's electronic tools.

FIG. 1 shows a prior art heat radiator 10, which comprises a plurality of bent structures formed by punching metallic material like aluminum or copper. The heat radiator 10 can be glued with an electronic heat-emitting device (not shown) to help the electronic heat-emitting device effectively radiate heat out of the system, hence letting the electronic heat-emitting device operate under permissible temperatures.

However, because a plurality of grooves 101 are spaced on the above heat radiator 10, the contact area with the electronic heat-emitting device is reduced, thus decreasing heat-radiating effect of the heat radiator 10.

FIG. 2 shows another prior art heat radiator 11, which comprises a plurality of U-shaped plate bodies 111 formed by punching metallic material like aluminum or copper and then assembled with lumpy retaining elements 112. The heat radiator 11 can be glued with an electronic heat-emitting device (not shown) to help the electronic heat-emitting device effectively radiate heat out of the system, hence letting the electronic heat-emitting device operate under permissible temperatures.

Although the above heat radiator 11 can increase the contact area with an electronic heat-emitting device, because the lumpy retaining elements 112 are retained with one another, the whole heat radiator 11 cannot be bent. Because today's electronic heat-emitting devices (e.g., hot tubes) are diversified, usage of the heat radiator 11 is reduced because it cannot be bent.

Accordingly, the above heat radiators have inconvenience and drawbacks in practical use. The present invention aims to resolve the problems in the prior art.

SUMMARY OF THE INVENTION

The primary object of the present invention is to provide a combination heat radiator capable of increasing contact area with an electronic heat-emitting device and providing better heat-radiating effect for the electronic heat-emitting device. Moreover, the combination heat radiator can be bent according to the shape of an electronic heat-emitting device to greatly enhance the heat-radiating efficiency and effectively reduce the production cost.

To achieve the above object, the present invention provides a combination heat radiator, which is a plate body formed by cutting thermal conductive material like aluminum, copper, or graphite. A plurality of spaced openings are formed by punching one side of the plate body. A connection portion is disposed on the other side of the plate body. Remaining materials of the plurality of openings are bent upwards to form a plurality of heat-radiating fins. The connection portion can be conveniently bent by a user to match the shape of different optoelectronic heat-emitting devices. The openings of the plate body are staggered with openings of another plate body to facilitate engagement of the two plate bodies. Complete heat-radiating fins are thus formed. The complete heat-radiating fins can be joined with an optoelectronic heat-emitting device by using thermal conductive glue. Thereby, the applicability of the heat-radiating fins can be enhanced, and expenses for developing different heat-radiating fins can be effectively reduced to greatly lower the production cost.

The various objects and advantages of the present invention will be more readily understood from the following detailed description when read in conjunction with the appended drawing, in which:

DETAILED DESCRIPTION OF THE PREFERRED EMBODIMENTS

Figure 1:
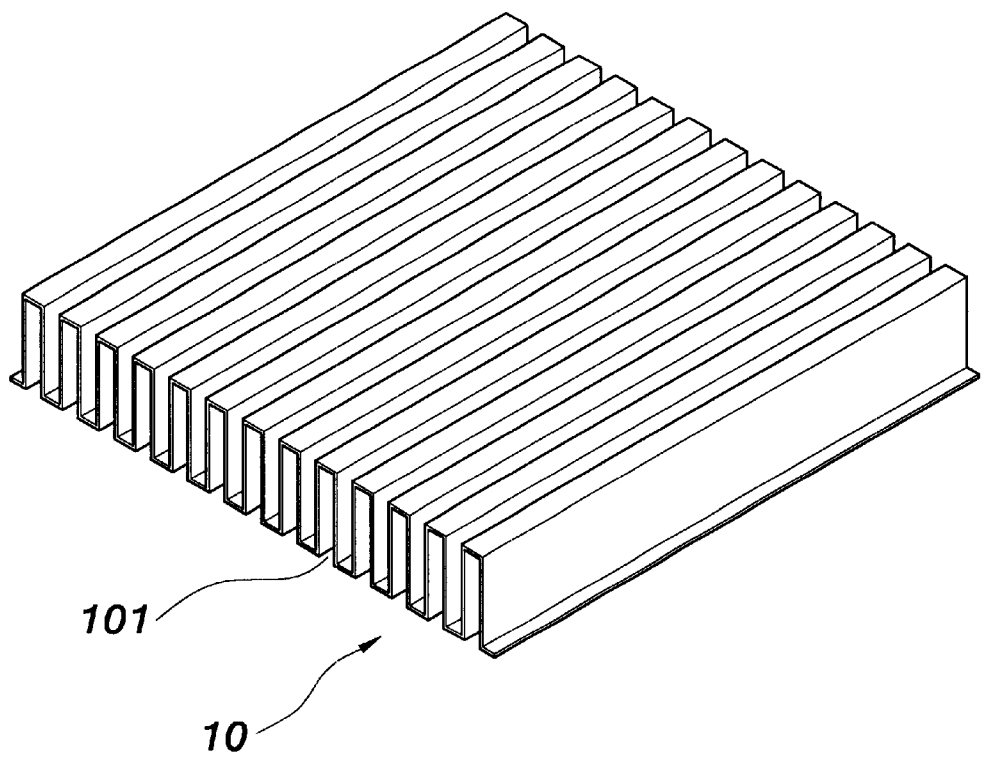
FIG. 1 is a perspective view of a prior art heat radiator.
Figure 2:
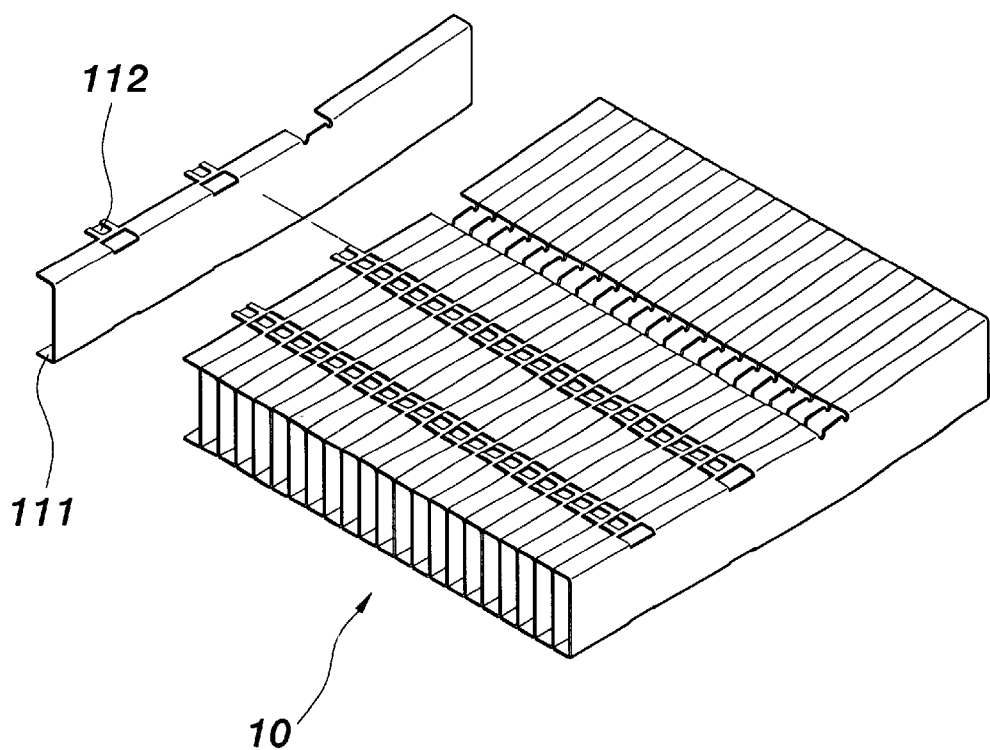
FIG. 2 is an exploded perspective view of another prior art heat radiator.
Figure 3:
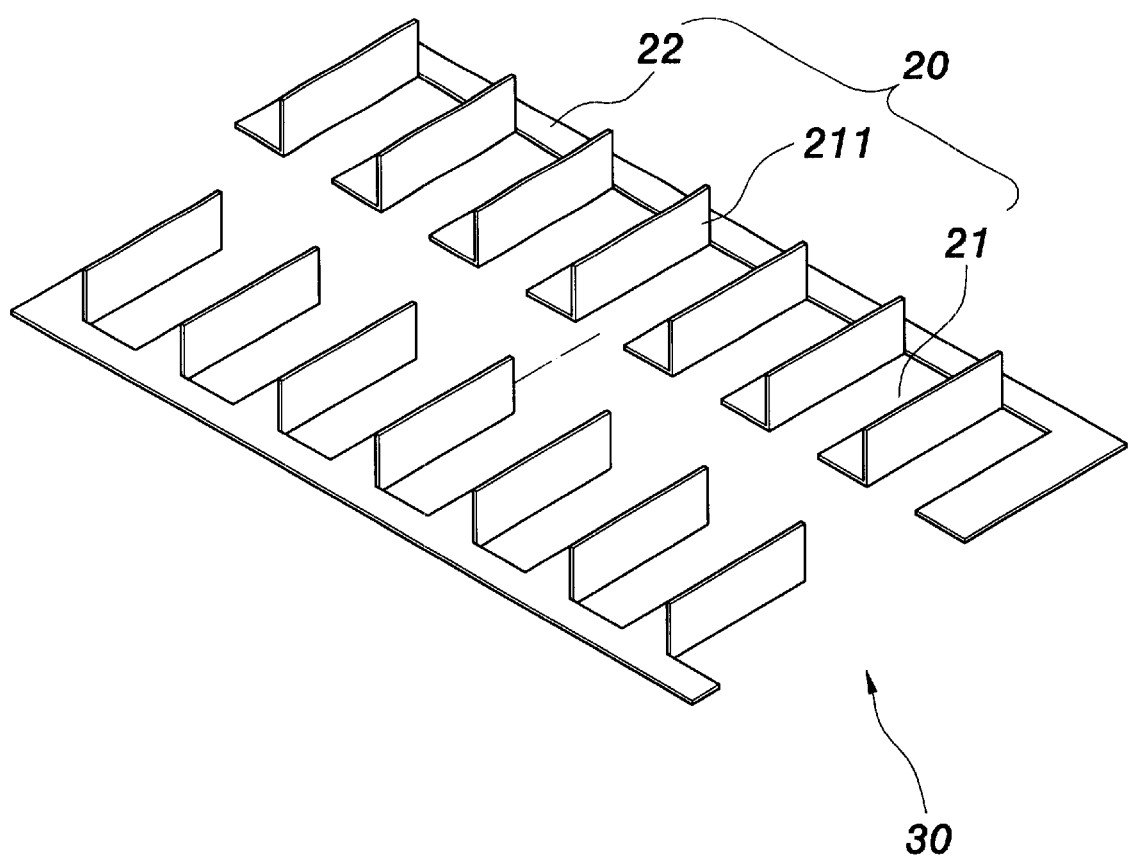
FIG. 3 is an exploded perspective view of the present invention.

As shown in FIG. 3, the present invention relates to a combination heat radiator and, more particularly, to an improved combination heat radiator capable of increasing contact area with an electronic heat-emitting device and being bent to match the shape of an optoelectronic heat-emitting device. The combination heat radiator is a plate body 20 formed by cutting thermal conductive material like aluminum, copper, or graphite. A plurality of spaced openings 21 are formed by punching one side of the plate body 20. A connection portion 22 is disposed on the other side of the plate body 20. Remaining materials of the plurality of openings 21 are bent upwards to form a plurality of heat-radiating fins 211. The upwards-bent heat-radiating fins 211 can decrease wastage of remaining materials of the plate body 20, hence lowering material cost of the plate body 20.

Figure 4:
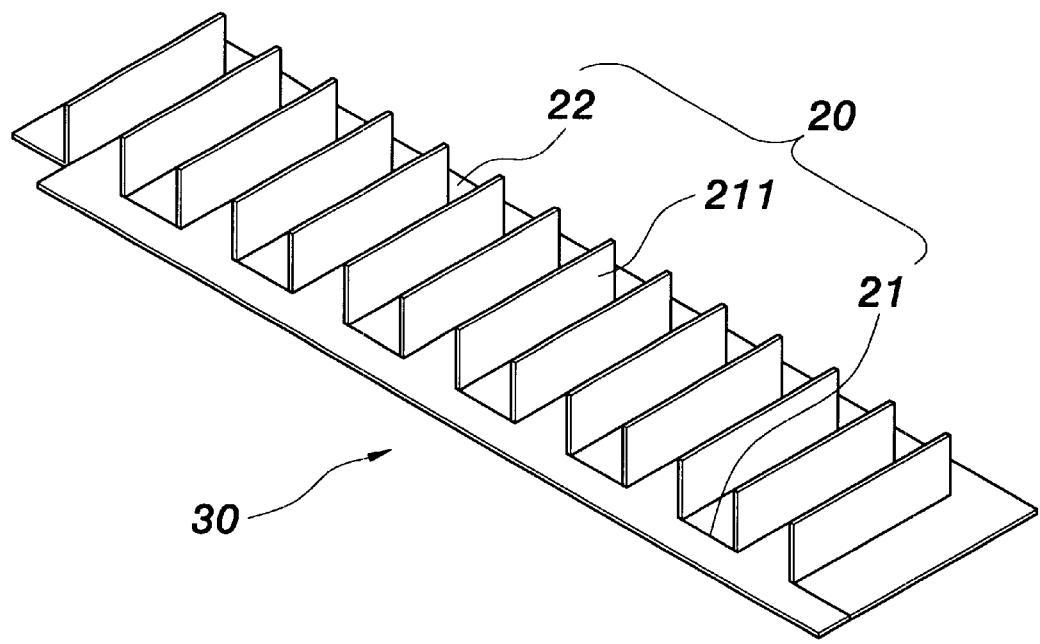
FIG. 4 is an assembled perspective view of the present invention.
Figure 5:
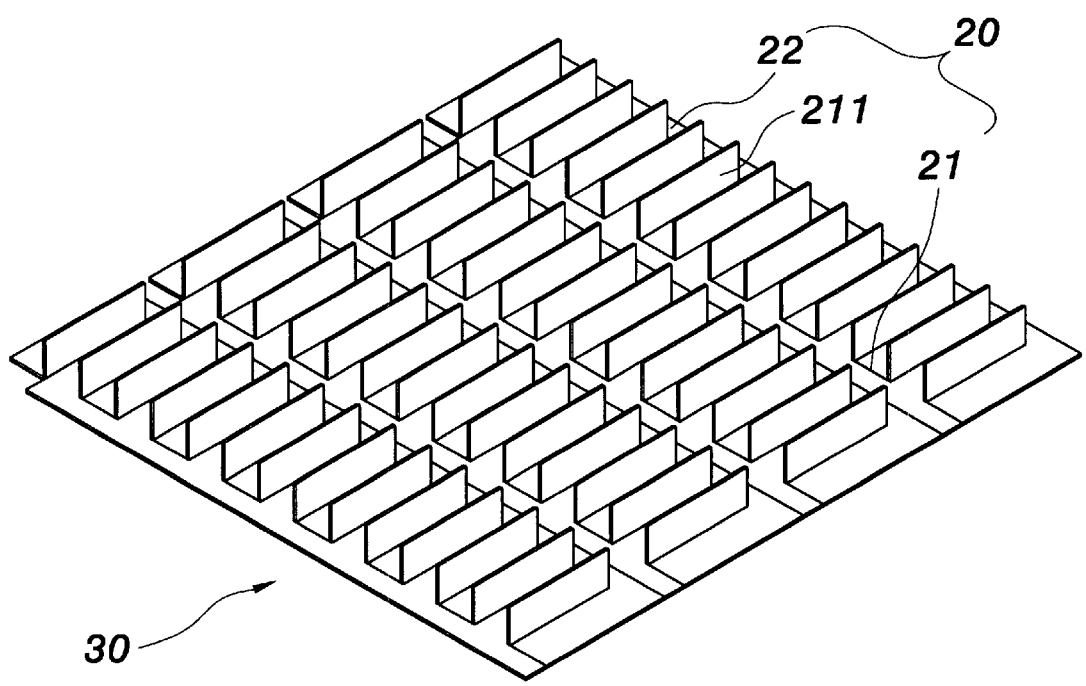
FIG. 5 is a use state of the present invention.
Figure 7:
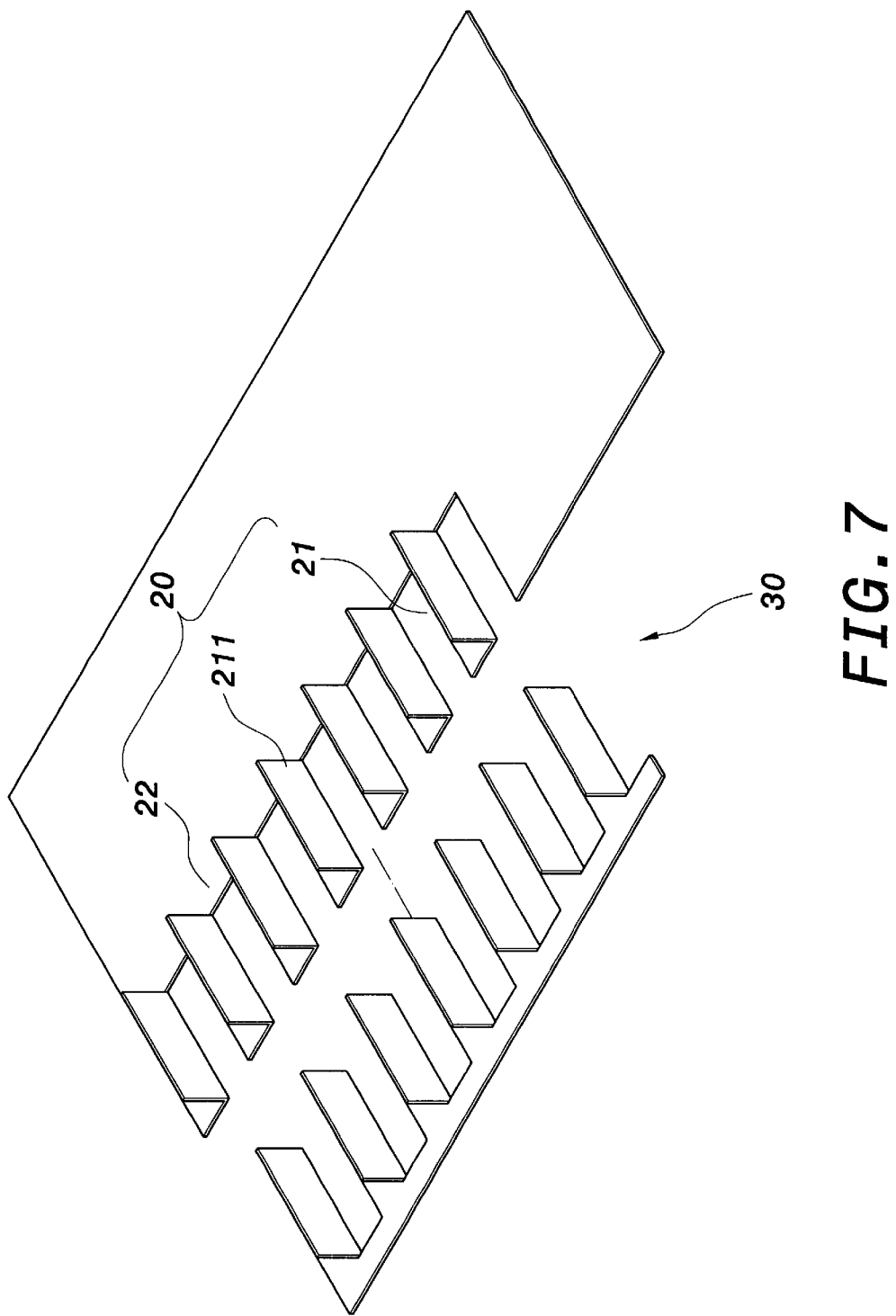
FIG. 7 is an exploded perspective view of another embodiment of the present invention.

As shown in FIGS. 3, 4, and 5, the openings 21 of the plate body 20 are staggered with openings 21 of another plate body 20 to facilitate engagement of the two plate bodies 20, thereby forming complete heat-radiating fins 30. The complete heat-radiating fins 30 can be glued with a heat-emitting device (not shown) by using thermal conductive glue (not shown) to help the heat-emitting device effectively radiate heat out of the system, thereby letting the heat-emitting device operate under permissible temperatures. The number of the connection portions 22 of the heat-radiating fins 30 can increase or decrease according to the area of the heat-emitting device (not shown) to conform with practicability of the heat-radiating fins 30, as shown in FIG. 7.

Figure 6:
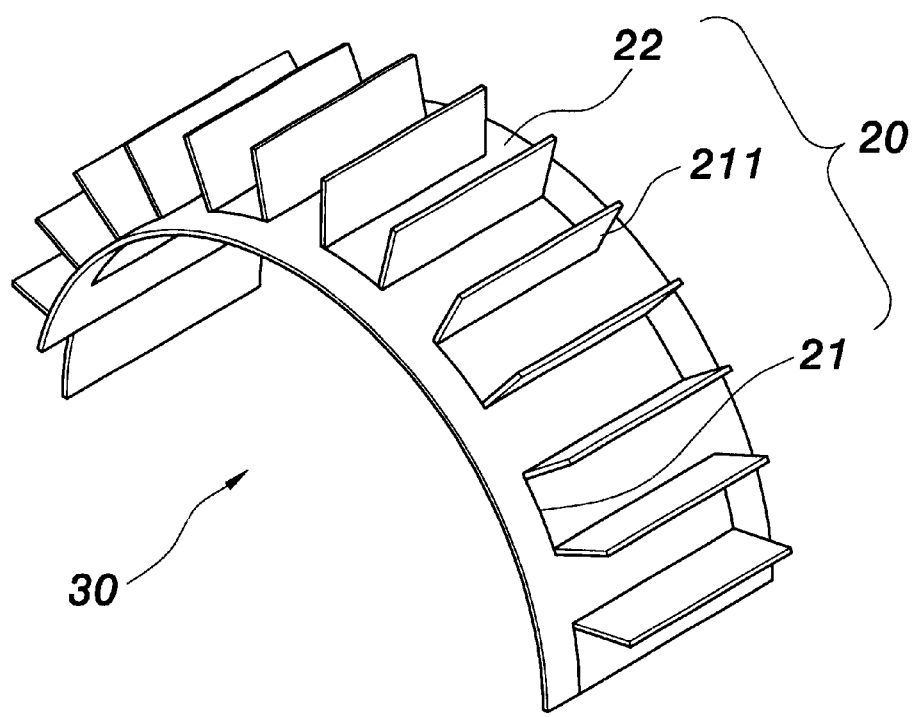
FIG. 6 is another use state of the present invention.

As shown in FIG. 6, the connection portion 22 of the plate body 20 can be conveniently bent by a user to match the shape of different heat-emitting devices, thereby enhancing practicability of the heat-radiating fins 30. Moreover, expenses for developing different heat-radiating fins 30 can be effectively reduced to greatly lower the production cost.

To sum up, the combination heat radiator of the present invention has at least the following advantages.

1. Remaining materials of the openings 21 of the plate body 20 are bent upwards to form the heat-radiating fins so as to reduce wastage of remaining materials of the plate body 20, hence effectively lowering material cost of the plate body 20.
2. The connection portion 22 of the plate body 20 can be bent to match the shape of a heat-radiating device so as to enhance practicability of the complete heat-radiating fins and greatly lowering the production cost.
3. Contact area with a heat-emitting device can increase to provide better heat-radiating effect for the heat-emitting device.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A combination heat radiator comprising at least a plate body, a plurality of spaced openings being formed by punching one side of said plate body, a connection portion being disposed on the other side of said plate body, remaining materials of said openings being bent upwards to form a plurality of upright heat-radiating fins; wherein said openings of said plate body are staggered with openings of another plate body to facilitate engagement of said twp plate bodies whereby good heat-radiating efficiency can be achieved.

2. The combination heat radiator as claimed in claim 1, wherein said plate body is formed by cutting material having good thermal conductivity.

3. The combination heat radiator as claimed in claim 1, wherein said connection portion can be conveniently bent by a user.

4. The combination heat radiator as claimed in claim 1, wherein the size of said connection portion can be enlarged according to the area of a heat-emitting device so that said combination heat radiator can be directly placed on the heat-radiating device for use.

5. The combination heat radiator as claimed in claim 1, wherein said heat-radiating fins can be glued with a heat-emitting device.

6. The combination heat radiator as claimed in claim 3, wherein the number of said heat-radiating fins can increase or decrease according to the area of a heat-emitting device.

* * * * *